US007977218B2

(12) United States Patent
Chen et al.

(10) Patent No.: US 7,977,218 B2
(45) Date of Patent: Jul. 12, 2011

(54) THIN OXIDE DUMMY TILING AS CHARGE PROTECTION

(75) Inventors: Cinti Chen, Fremont, CA (US); Yi He, Fremont, CA (US); Wenmei Li, San Jose, CA (US); Zhizheng Liu, San Jose, CA (US); Ming-Sang Kwan, San Leandro, CA (US); Yu Sun, Saratoga, CA (US); Jean Yee-Mei Yang, Glendale, CA (US)

(73) Assignee: Spansion LLC, Sunnyvale, CA (US)

( * ) Notice: Subject to any disclaimer, the term of this patent is extended or adjusted under 35 U.S.C. 154(b) by 354 days.

(21) Appl. No.: 11/645,475

(22) Filed: Dec. 26, 2006

(65) Prior Publication Data

US 2008/0153269 A1   Jun. 26, 2008

(51) Int. Cl.
*H01L 21/00* (2006.01)
(52) U.S. Cl. ........ 438/491; 438/283; 438/287; 438/296; 438/591; 257/E21.66; 257/E21.678; 257/E21.683
(58) Field of Classification Search ................ 438/157, 438/216, 262–264, 288, 491, 587–588, 591–592, 438/275, 283, 257, 258, 261, 287, 468, 761, 438/778, 787, 292, 296; 365/185.05; 257/E21.625, 257/E21.639, 314, 316, 324, 326, E21.654, 257/E21.66, E21.675, E21.679, E21.68, E21.681, 257/E21.678, E21.683–E21.689, E23.66, 257/E23.678, E23.683, E21.09
See application file for complete search history.

(56) References Cited

U.S. PATENT DOCUMENTS

| 5,668,035 | A | * | 9/1997 | Fang et al. ................ 438/239 |
| 5,885,856 | A | | 3/1999 | Gilbert et al. |
| 5,998,264 | A | * | 12/1999 | Wu ........................... 438/260 |
| 6,157,067 | A | | 12/2000 | Hsu et al. |
| 6,211,016 | B1 | * | 4/2001 | Wu ........................... 438/264 |
| 6,255,169 | B1 | * | 7/2001 | Li et al. .................... 438/264 |
| 6,277,723 | B1 | | 8/2001 | Shih et al. |
| 6,383,861 | B1 | * | 5/2002 | Gonzalez et al. .......... 438/241 |
| 6,432,726 | B2 | | 8/2002 | Iranmanesh |
| 6,569,723 | B2 | * | 5/2003 | Liaw ......................... 438/153 |
| 6,645,801 | B1 | * | 11/2003 | Ramsbey et al. .......... 438/216 |
| 6,797,565 | B1 | * | 9/2004 | Yang et al. ................ 438/261 |
| 6,867,956 | B2 | | 3/2005 | Clark et al. |
| 6,897,110 | B1 | | 5/2005 | He et al. |
| 6,905,967 | B1 | | 6/2005 | Tian et al. |
| 7,030,012 | B2 | * | 4/2006 | Divakaruni et al. ........ 438/652 |
| 7,033,900 | B1 | | 4/2006 | Rekhi et al. |
| 7,120,063 | B1 | * | 10/2006 | Liu et al. ................ 365/185.24 |
| 7,410,857 | B2 | * | 8/2008 | Higashi et al. ............. 438/216 |
| 2002/0041526 | A1 | * | 4/2002 | Sugita et al. ............. 365/200 |
| 2002/0048192 | A1 | * | 4/2002 | Wang et al. ............ 365/185.29 |

(Continued)

*Primary Examiner* — Matthew C Landau
*Assistant Examiner* — Joseph C Nicely
(74) *Attorney, Agent, or Firm* — Eschweiler & Associates, LLC

(57) ABSTRACT

Novel fabrication methods implement the use of dummy tiles to avoid the effects of in-line charging, ESD events, and such charge effects in the formation of a memory device region region. One method involves forming at least a portion of a memory core array upon a semiconductor substrate that involves forming STI structures in the substrate substantially surrounding a memory device region region within the array. An oxide layer is formed over the substrate in the memory device region region and over the STI's, wherein an inner section of the oxide layer formed over the memory device region region is thicker than an outer section of the oxide layer formed over the STI's. A first polysilicon layer is then formed over the inner and outer sections comprising one or more dummy tiles formed over one or more outer sections and electrically connected to at least one inner section.

20 Claims, 14 Drawing Sheets

U.S. PATENT DOCUMENTS

| | | | |
|---|---|---|---|
| 2003/0098479 A1* | 5/2003 | Murthy et al. | 257/288 |
| 2003/0132475 A1* | 7/2003 | Kanamori | 257/306 |
| 2004/0120198 A1* | 6/2004 | Schwalbe et al. | 365/202 |
| 2004/0259298 A1* | 12/2004 | Graf et al. | 438/197 |
| 2005/0191808 A1* | 9/2005 | Steimle et al. | 438/260 |
| 2006/0063364 A1* | 3/2006 | Stephens et al. | 438/585 |
| 2006/0086953 A1* | 4/2006 | Lee et al. | 257/213 |
| 2006/0231910 A1* | 10/2006 | Hsieh et al. | 257/413 |
| 2007/0070673 A1* | 3/2007 | Borkar et al. | 365/63 |
| 2007/0077713 A1* | 4/2007 | Ha et al. | 438/270 |
| 2008/0265309 A1* | 10/2008 | Higashi et al. | 257/324 |
| 2009/0154214 A1* | 6/2009 | Sugimae et al. | 365/51 |

\* cited by examiner

DEVICES OR ARRAY OF CORE CELLS

THIN OXIDE DUMMY TILING AS CHARGE PROTECTION

FIELD OF INVENTION

The present invention relates generally to memory devices and the like, and in particular to protection against the deleterious effects of in line charging on devices, by utilizing dummy tiles for charge protection in memory fabrication.

BACKGROUND OF THE INVENTION

It is well known in the art that certain processes, for example, etching can cause in line charging of devices/memory, that can cause non-uniformity of charge in the device/memory and therefore result in poor memory performance (e.g., program and/or erase losses due to high threshold voltage (Vt), etc.). Wafer charging damage during IC processing and manufacturing steps is the result of complex interactions between the wafer environment and the wafer. Charge trapping in the charge storage materials can result in, for example, threshold voltage shifts, increased junction leakage, etc. Scaling down of semiconductors devices to meet ever increasing performance demands for devices can also result in increased leakage current, threshold voltage variability, and the like, both within and across wafer dies. There is a strong need for manufacturing approaches that address these problems in an efficient and cost effective manner, for example.

Charging damage of various devices typically occurs during metal and/or poly etch, dielectric deposition, via formation and/or other charge creating processes used to manufacture the semiconductor device. The damage can result when ions and electrons are introduced by a plasma process bombarding the surface of a metal structure that is electrically connected to a transistor device. The plasma ions and electrons can force current through a thin gate oxide by way of conductive structures connected electrically to the gate oxides. If adequate charge is transported through the oxide, the operational lifetime of the device can be reduced significantly, the device may fail during the charging process itself, and the like.

Charge can also accumulate on a semiconductor surface until catastrophic breakdown or an electrostatic discharge (ESD) event occurs. ESD events can damage, for example, semiconductors, photo-masks, hard-masks, and the like. Electrostatic discharge can also produce electrical signals or electromagnetic interference (EMI) that interferes with the operation of equipment, such as, the production equipment. These ESD problems can occur, for example, throughout the semiconductor manufacturing and packaging process, including silicon wafer creation, photo-mask layering and etching, device manufacturing, back-end processing, packaging and test. Many of these ESD problems can persist throughout the entire "life cycle" of the semiconductor device. In addition damage may be more subtle and more difficult to detect, for example, permanent alteration of the dielectric breakdown properties.

Implanted dopant ions, well known in the art, are electrically charged, a consequence of the ion implantation process. Charge imbalance related with ion implantation is attributed to a number of occurrences, for example, ejection of secondary electrons, discharge of other charged species from the wafer, absorption of ions from surrounding area, and the like. The charging properties or effects associated with ion implantation are difficult to model and/or measure. Furthermore, the charge distribution will fluctuate over the surface of the wafer because of variations in the ion beam, the variable characteristics of the wafer surface, surface areas of the wafer with different conductivities, excess charge already present on the wafer, etc. Excess charge distributions can vary from wafer to wafer, as well. All of these factors contribute to non-uniform charge distributions on the wafer surface which can have serious consequences on semiconductors devices that are continuously being reduced in size. Semiconductor manufacturing technologies will continue to move toward smaller device geometries in the foreseeable future and acceptable ESD levels will continue to decrease with decreasing device dimensions, as well as the need for uniform charge distributions.

Thus, there is a critical need to provide a method which improves the charge distribution but which does not suffer from the problems that are currently present with processes, such as gate leakage, unacceptable threshold voltages, ESD events, and the like, and to do so in an affordable way.

SUMMARY OF THE INVENTION

The following presents a simplified summary in order to provide a basic understanding of some aspects of the invention. This summary is not an extensive overview of the invention. It is intended to neither identify key or critical elements of the invention nor to delineate the scope of the invention. Rather, the primary purpose of this summary is to present some concepts of the invention in a simplified form as a prelude to the more detailed description that is presented later.

The present invention pertains to implementing dummy tiles to more advantageously distribute charge in the memory fabrication process. The dummy tiles with a variable oxide thickness and a polysilicon cap form a charge trapping region. Since a thinner oxide layer has a lower impedance and a lower voltage breakdown than thicker oxide layer the dummy tiling can act as a "charge drain" for in-line charging, to protect the device of interest, to prevent ESD events, to create a more uniform charge distribution, and the like.

According to one or more aspects of the present invention, a method of creating a "charge drain" that connects to the device or cell array of interest, needing charge protection. The device can be connected to the dummy tile utilizing a "poly-bridge" as illustrated in FIG. 8a, for example and the dummy tile and the poly-bridge are later etched away from the device or array of interest.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
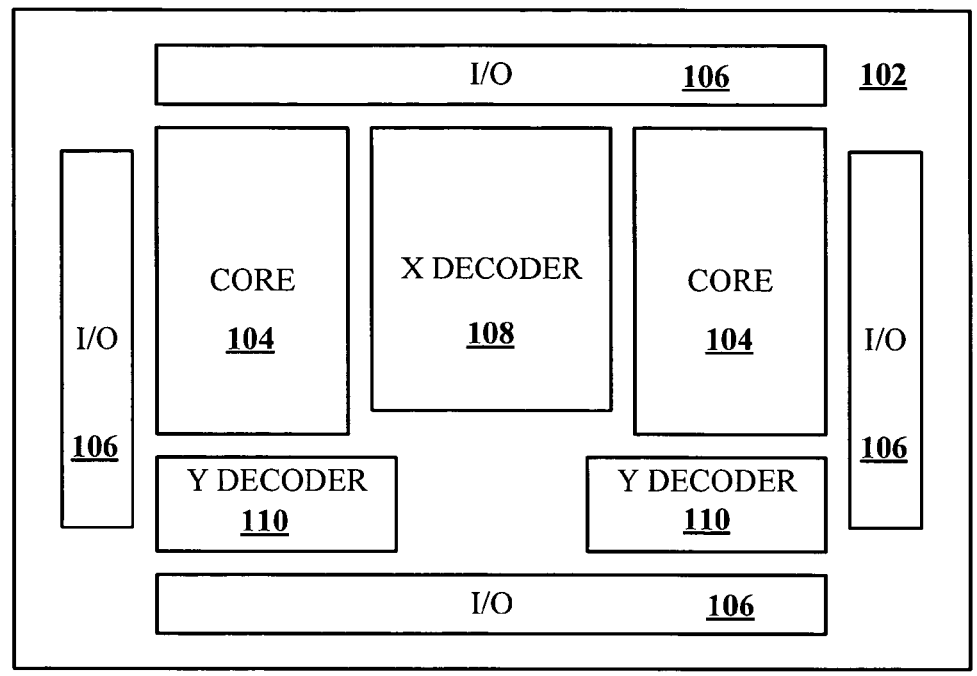
FIG. 1 is a prior art top view of an exemplary dual bit flash memory cell in accordance with current art.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one of ordinary skill in the art that one or more aspects of the present invention may be practiced with a lesser degree of these specific details. In other instances, well-known structures and devices are shown in block diagram or other form in order to facilitate describing one or more aspects of the present invention.

The present invention pertains to implementing a dual poly (polysilicon) process in forming a memory device along with dummy tiles. The process employs utilizing a poly-1 doping process subsequent to the poly-2 deposition process. The doping process can be performed with or without a masking process step performed prior to the doping process. The process facilitates a reduction in ESD events allowing more semiconductors to be manufactured and processed without failure. As a result, more devices can be manufactured in a given time frame with a higher yield.

Referring initially to FIG. 1, a prior art top view of an exemplary dual bit flash EEPROM 100, for example, is illustrated. The memory 100 generally incorporates a semiconductor substrate 102 in which one or further high-density core regions 104 and one or more lower-density peripheral portions are formed. The high-density core regions characteristically include one or more M by N arrays 104 of individually addressable, substantially identical dual bit flash memory cells. The lower-density peripheral portions on the other hand typically include input/output (I/O) circuitry 106 and programming circuitry for selectively addressing the individual memory cells. The programming circuitry is represented in part by and includes one or more x-decoders 108 and one or more y-decoders 110 that collaborate with the I/O circuitry 106 for selectively connecting a source, gate, and/or drain of selected addressed memory cells to predetermined voltages or impedances to effect designated operations on the respective memory cells (e.g., programming, reading, and erasing, and deriving necessary voltages to effect such operations).

Figure 2:
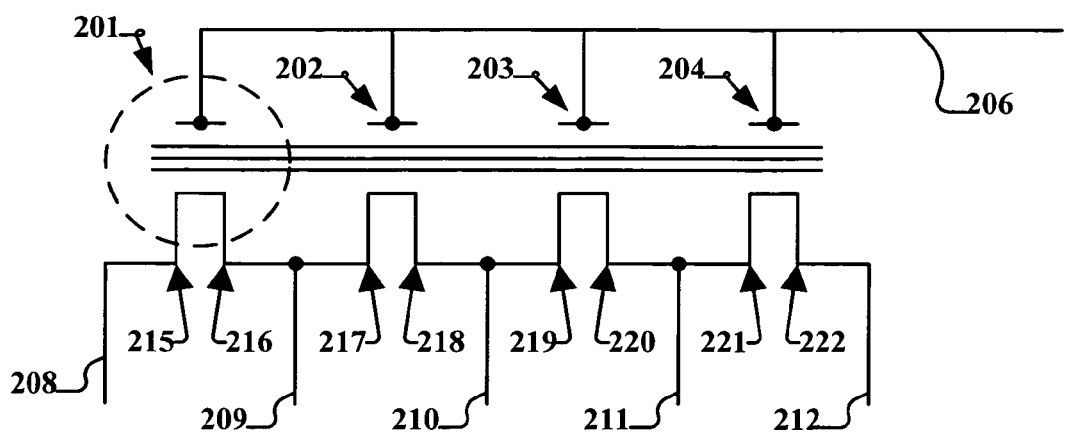
FIG. 2 is a prior art schematic illustration of a portion of a memory core such as may include at least part of one of the M by N array cores, in accordance with existing art.

Turning to FIG. 2, a prior art schematic illustration is presented of a portion 200 of a memory core such as may include at least part of one of the M by N array cores 104 depicted in FIG. 1. The circuit schematic shows a line of memory cells, which includes memory cells 201 through 204 in a virtual ground type implementation, for example. The respective memory cells 201 through 204 are connected to a wordline 206, which serves as a control gate, and pairs of the memory cells share a common bitline. For instance, in the example shown, the memory cell 201 has associated bitlines 208 and 209; the memory cell 202 has associated bitlines 209 and 210; the memory cell 203 has associated bitlines 210 and 211; and the memory cell 204 has associated bitlines 211 and 212. As such, cells 201 and 202 share bitline 209, cells 202 and 203 share bitline 210 and cells 203 and 204 share bitline 211, respectively.

Depending upon a signal on the wordline and the connection of the bitlines in a memory cell to an electrical source or drain, the memory cells 201 through 204 are capable of writing, reading, and erasing bits at locations 215 through 222. For example, control of the bit at location 215 is achieved through connection of the drain to the bitline 208 and the source to the bitline 209. Similarly, control of the bit at location 216 is achieved through connection of the drain to the bitline 209 and the source to the bitline 208. It will be appreciated that although adjacent memory cells share common bitlines, the adjacent memory cells do not interfere with each other because the memory cells are typically programmed one at a time and in such instances only one memory cell is active at a time while programming.

Figure 3:
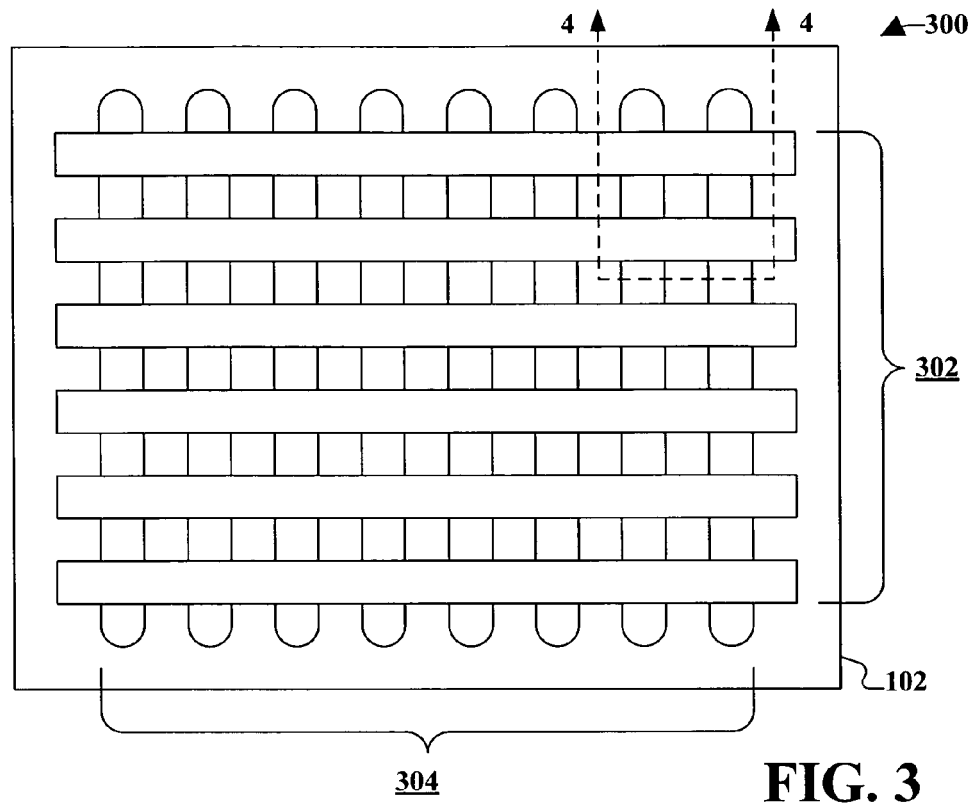
FIG. 3 is a prior art top view of at least a portion of a memory core, such as may include at least part of one of the M by N array cores, in accordance with current art.

Referring now to FIG. 3, a prior art top view is presented of at least a portion 300 of a memory core, such as may include at least part of one of the M by N array cores 104 depicted in FIG. 1. The memory 300 is formed upon a semiconductor substrate 102 and has a plurality of implanted bitlines 304 extending substantially parallel to one another, and further includes a plurality of formed wordlines 302 extending substantially in parallel to one another and at substantially right angles to the plurality of implanted bitlines 304. It will be appreciated that the wordlines 302 and bitlines 304 have contacts and interconnections (not shown) to programming circuitry such as may be represented, at least in part, by the x-decoders 108 and y-decoders 110 depicted in FIG. 1.

Figure 4:
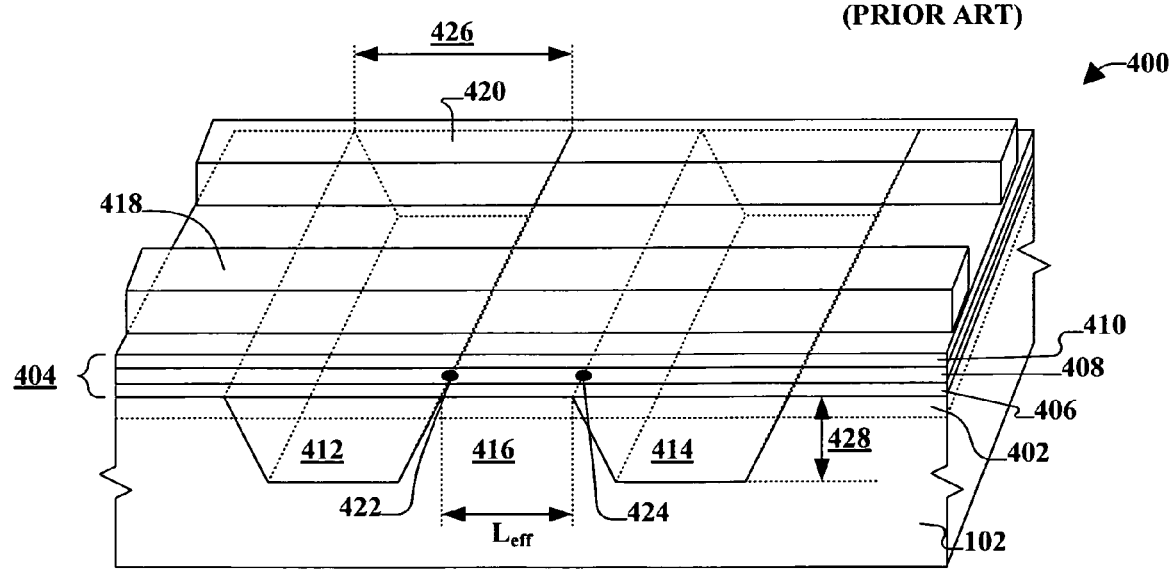
FIG. 4 is a prior art cross-sectional isometric illustration of a portion of a dual bit flash memory, in accordance with current art, in accordance with current art.

FIG. 4 is a cross-sectional isometric prior art illustration of a portion 400 of a dual bit flash memory, such as that taken along line 4-4 of FIG. 3. A semiconductor substrate 102 upon which the memory is formed is doped with a p-type impurity such as boron, for example, to establish a threshold adjustment implant region 402 therein. The threshold adjustment implant provides a region 402 that is more heavily doped than the semiconductor substrate 102. The substrate can, for example, be formed out of silicon and can itself be doped with a p-type impurity. The threshold adjustment implant 402 assists in controlling a threshold voltage of the various cells within the memory 400.

A charge-trapping dielectric layer 404 is deposited over the semiconductor substrate 102. The charge-trapping dielectric layer 404 generally can be composed of three separate layers: a first insulating layer 406, a charge-trapping layer 408, and a second insulating layer 410. The first and second insulating layers 406 and 410 are typically formed of an oxide dielectric such as silicon dioxide ($SiO_2$) and the charge-trapping layer 408 is generally formed of a nitride dielectric such as silicon nitride ($Si_xN_y$). The oxide-nitride-oxide configuration is commonly referred to as an ONO layer for convenience. Alternatively, other types of charge-trapping layers may be employed and are contemplated as falling within the scope of the present invention.

First and second conductive bitlines 412 and 414 are depicted in FIG. 4 underlying the charge trapping dielectric layer 404. It will be appreciated that any number of such bitlines can be implanted into the semiconductor substrate 102, and that such bitlines may correspond to the bitlines 304 depicted in FIG. 3. The bitlines are typically formed of an implanted n-type material, such as arsenic, and may include an oxide portion (not shown) in some examples. The first and second conductive bitlines 412 and 414 are spaced apart and define a channel region 416 there-between.

First and second conductive wordlines 418, 420 are similarly depicted overlying the charge-trapping dielectric layer 404. It will be appreciated that any number of such wordlines can be formed over the dielectric layer 404, and that such wordlines may correspond to the wordlines 302 depicted in FIG. 3. The wordlines can be formed out of a polysilicon material, for example, where the polysilicon material may be deposited over the dielectric layer 404 and then patterned and etched.

Locations 422 and 424 indicate generally where respective bits of data can be stored in one or the cells of the memory 400. It will be appreciated that the channel 416 has an effective length Leff and that the bits 422, 424 will be brought closer together as this length is reduced (e.g., as a result of scaling). As such, the bits themselves may interfere with and/or contaminate one another and operations performed on one bit may affect the other bit should the bits get too close to one another.

In the example shown, the buried bitlines 412, 414 are formed to a width 426 and a depth 428. Conventionally, such a width 426 can be around 50 to 200 nanometers, while such a depth 428 can be on the order of around 300-1500 Angstroms, for example. These dimensions coupled, primarily, with the electrical properties of the overlying ONO layer 404 produce a breakdown or threshold voltage (Vt) between the bitlines and wordlines of around 15-40 volts.

Figure 5:
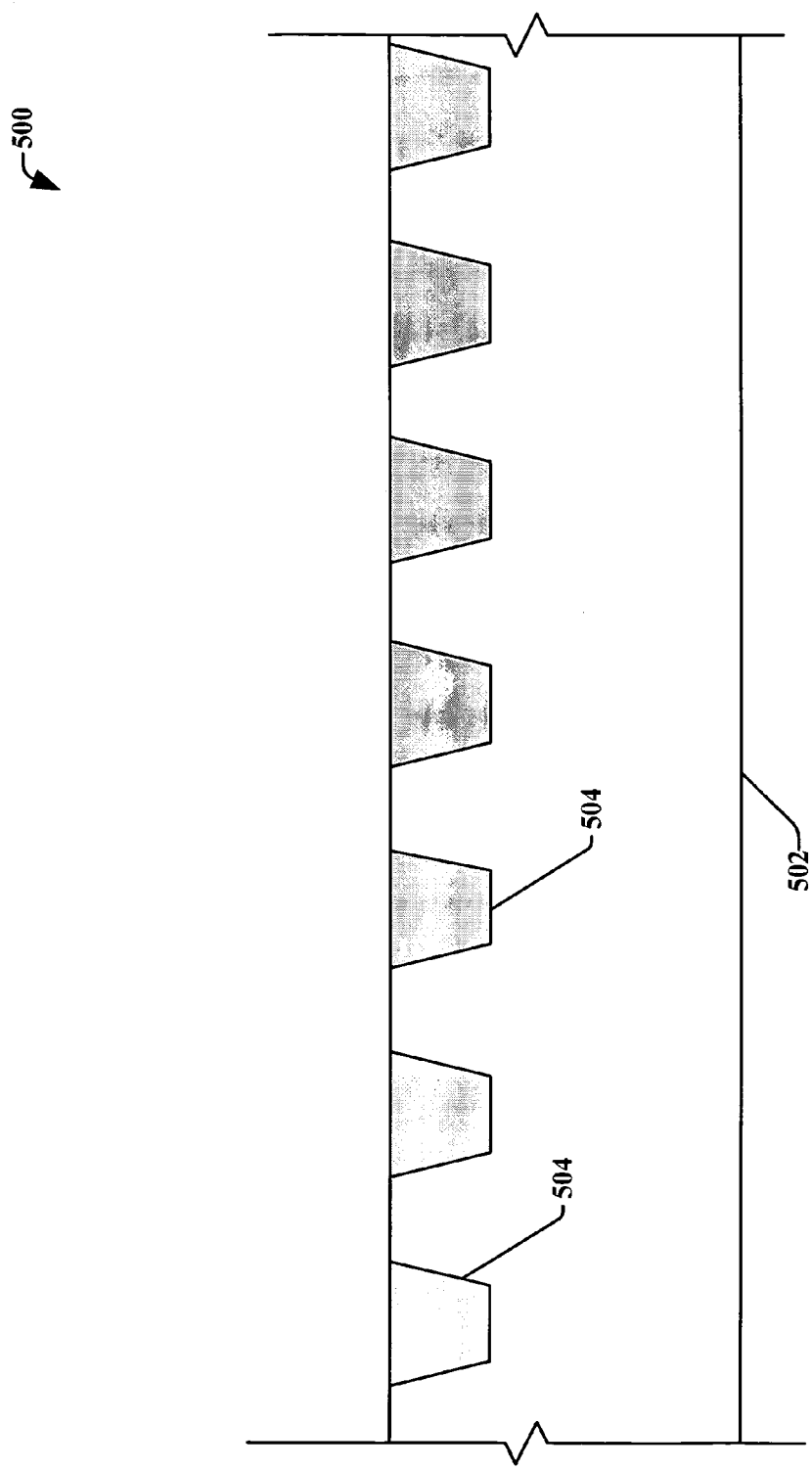
FIG. 5 is a prior art side view of an exemplary portion of a memory device, in accordance with existing art.

Referring to FIG. 5, a prior art side view of an exemplary portion of a memory device 500, for example, is illustrated. The memory 500 generally includes a semiconductor substrate 502 in which one or more high-density core regions and one or more lower-density peripheral portions are formed. As mentioned supra, the high-density core regions normally contain one or more M by N arrays of individually addressable, substantially identical memory cells. The lower-density peripheral portions on the other hand typically include input/output (I/O) circuitry and programming circuitry for selectively addressing the individual memory cells.

The memory device 500 can incorporate shallow trench isolation regions 504 within the substrate 502, for example. Integrated circuits are manufactured by fabricating electrical devices on semiconductor substrates and interconnecting the various electrical devices. Shallow trench isolation 504 (STI) is a technique that is used to electrically isolate transistors or electrical devices and is a facilitating technology for the fabrication of advanced microelectronic devices, for example, complementary metal-oxide-semiconductors (CMOS).

STI has largely replaced localized oxidation of silicon (LOCOS) isolation methods in the fabrication of advanced microelectronic devices. STI 504 techniques can involve creating oxide isolation trenches for electrical separation or segregation in integrated circuits in order to avoid electromechanical interference (EMI) and/or parasitic leakage paths between the various devices. The oxide trench can be etched into the silicon substrate utilizing, for example, reactive ion etching (RIE), followed by employing a thermal oxidation process to line the trench walls with a thin layer of oxide, for example, $SiO_2$. The trench can then be filled with a gap-filling oxide isolation material. The structure can subsequently be chemically mechanically polished (CMP) to create a planar STI structure 504 such that electrical devices (inner active areas) can be formed within regions bounded by the STI 504, often referred to as moats or active area. Various fabrication methods for creating STI 504 are well known by those of ordinary skill in the art and all are contemplated in the present invention.

Figure 6:
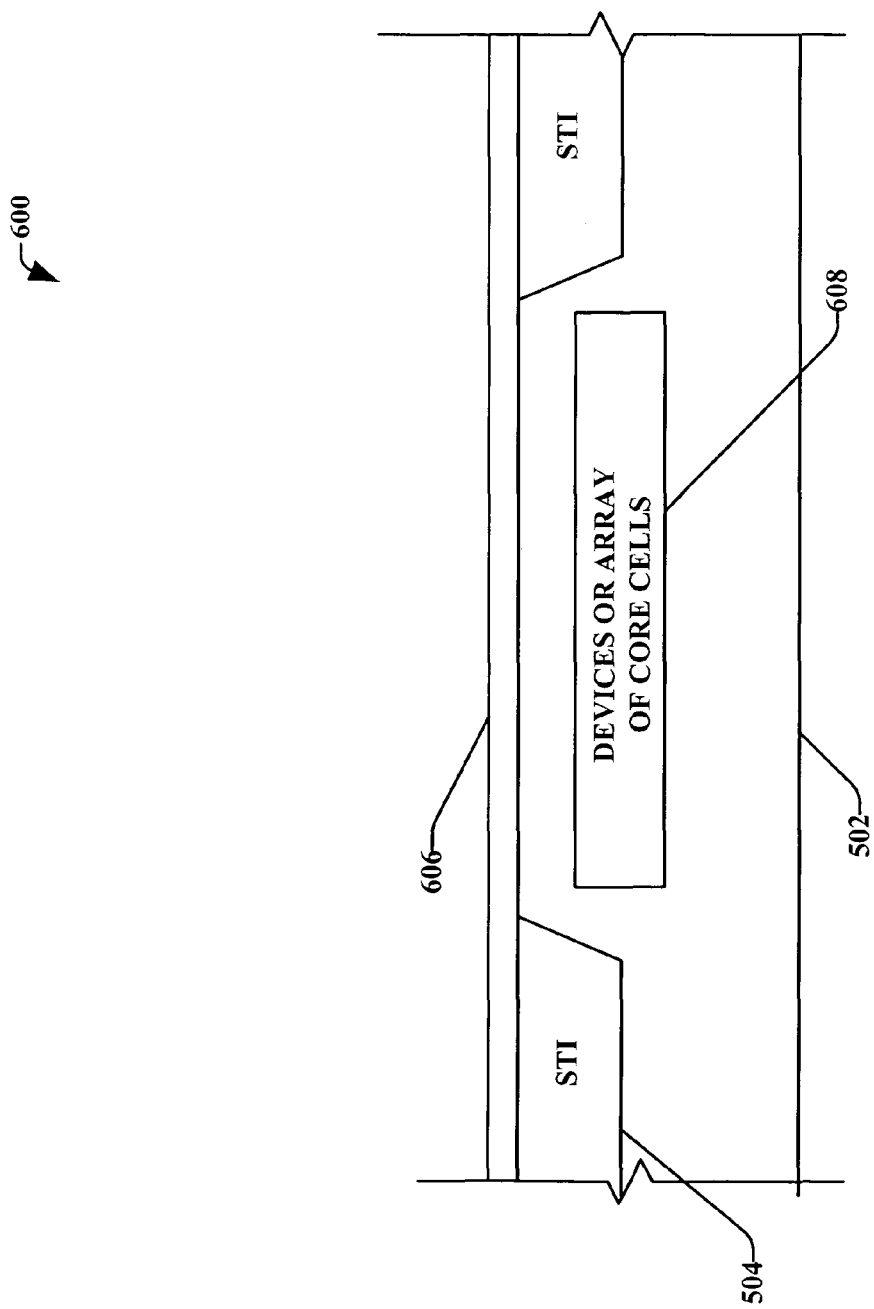
FIG. 6, illustrates a prior art portion of a memory device, in accordance with current art.

FIG. 6, illustrates a prior art portion of a memory device, wherein the substrate 502 can have an thin oxide layer 606 formed on top of its surface and the STI's 504 described supra. The oxide layer 606 can be a single oxide, a composite oxide layer (ONO layer), and the like. The memory device 600 can include an array of core cells 608 that is schematically represented as a rectangular box and one or more shallow trench isolation (STI) regions 504 that can be formed initially within the substrate 502.

Figure 7:
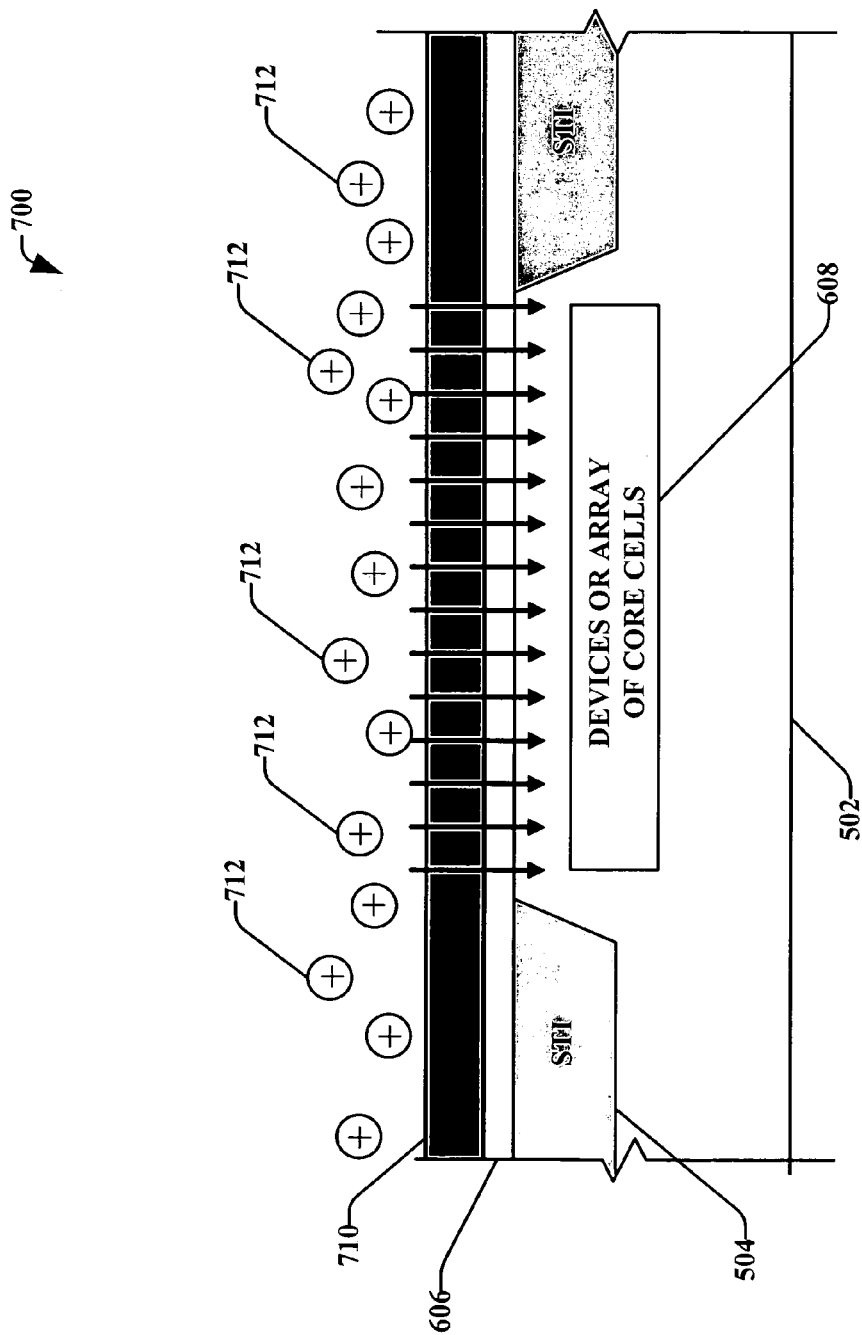
FIG. 7 is a prior art side schematic view of a memory device without dummy tiling in accordance with current art.

FIG. 7 illustrates prior art, wherein the substrate 502 and the STI regions 504 are already formed within the substrate 502 employing techniques know by those of ordinary skill in the art. It is to be appreciated that this invention could also apply to semiconductors fabricated or manufactured without STI regions 504, for example such as localized oxidation of silicon techniques, and the like and all such employments are contemplated in this invention. In accordance with one aspect of the invention, a method is provided for fabricating a recessed STI 504 for transistors. The method comprises forming one or more recessed STI structures 504 in an active area of a substrate 502. In one example, one or more isolation trenches are etched through a nitride and oxide layer (referred to as a hard mask) and into the isolation regions of the substrate 502 surface. The trenches can then be coated with a trench oxide and subsequently filled with an isolation material, for example, high density plasma (HDP) oxide that covers the remaining nitride and oxide layers, as well as, overfilling the trenches. The device can then be planarized by employing, for example, chemical mechanical polishing, followed by a deglaze process. The substrate 502 is subsequently wet etched to remove a portion of the isolation material in the trench to form the recessed STI 504, for example.

A first polysilicon layer 710 formed over the oxide layer 606 can be characteristically doped utilizing ions from, for example, an ion implantation system. The poly 1 layer 710 is typically uniformly distributed at a given thickness either as part of the memory core 608 or a shallow trench isolation field 504. A plurality of electrical charges 712 are represented by the plus sign and surrounding circle and the electrical charges 712 shown are representative of a charge distribution for this prior art arrangement. As illustrated in FIG. 7, the charges are uniformly distributed along the poly 1 layer 710. As illustrated in FIG. 7 there are no dummy tiles present to direct electrical charges 712.

Figure 8:
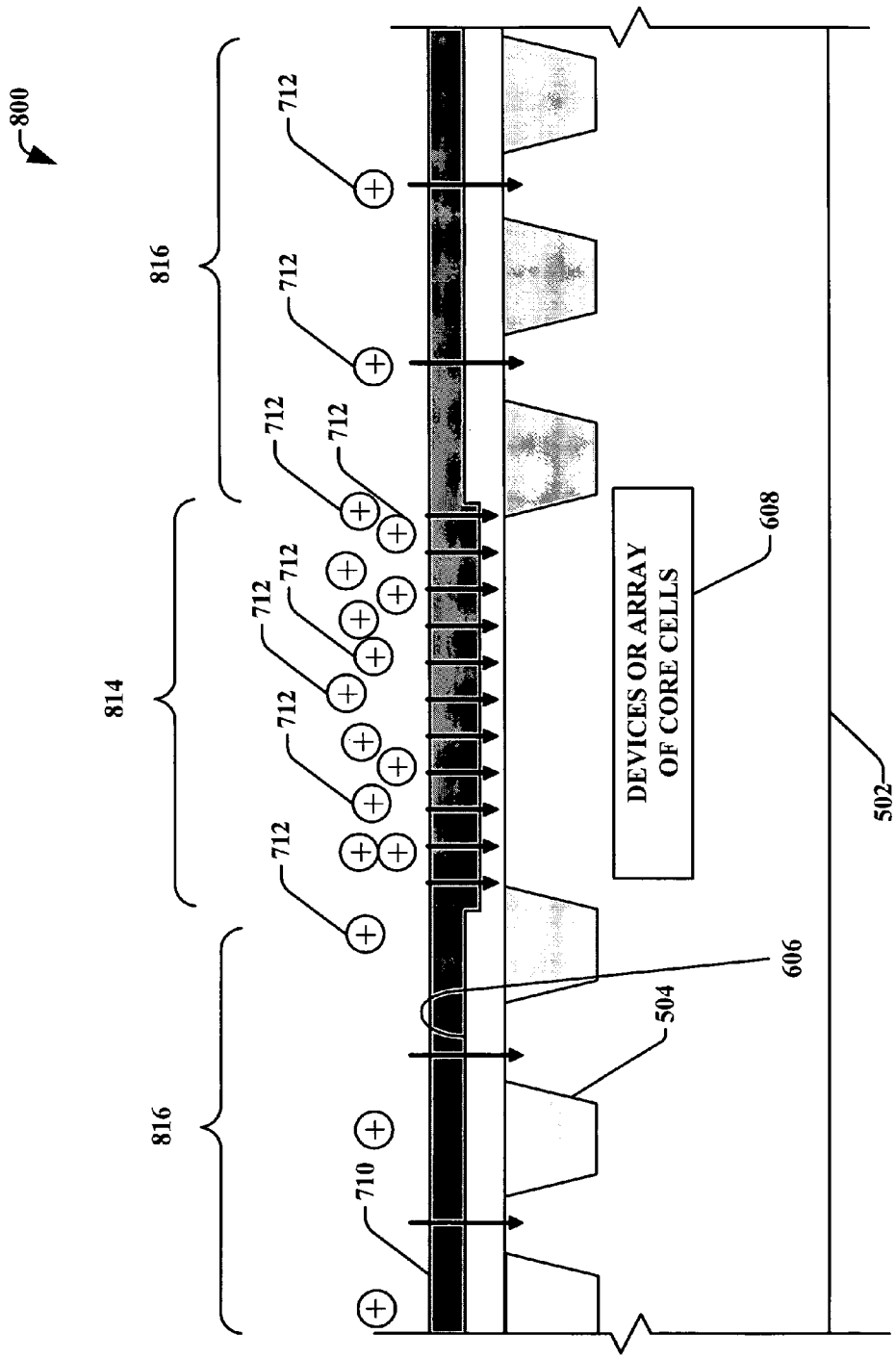
FIG. 8 is a side schematic illustration of a portion of a of a memory core in accordance with another aspect of the invention with dummy tiling that utilizes high voltage oxide.

Turning to FIG. 8, a schematic side view is presented of an exemplary memory core 800 such as may include at least one of an M by N array, for example. The schematic 800 shows a section of a silicon substrate 502 with STI regions 504 and a non-uniform oxide layer 606, formed on the substrate 502, wherein the oxide layer is thinner in the center section 814 and thicker at the outside area, for example. The outside areas are referred to as dummy tile sections 816, as they can be utilized to influence charge 712 distribution within an array of core cells 608 and the polysilicon layer on the top of dummy tiles 816 can be removed at a later process step, for example. A first polysilicon layer 710 is illustrated formed on top of the oxide layer 606. In this configuration the poly 1 layer 710 covers the entire oxide layer 606, for example. STI 504 are formed within the substrate 502 using known techniques in the art, for example, etching, depositing, chemical mechanical polishing, and the like. It will be appreciated that any number and configuration of dummy tiles 816 can be employed according to one or more aspects of the present invention and is contemplated herein.

In this exemplary configuration the largest distribution of electrical charges 712, is located at the center section 814 of the device 800 and the charges 712 can cause electrical charge issues for the array of core cells 608, negatively influencing the threshold voltage (Vt), for example. A fabricated wafer may have to be discarded because the voltage threshold in the wafer center is low, for example, and the wafer outer edge threshold voltage is high. This can result in lower wafer yields than anticipated. In addition, electrical charges flowing through the center region 814 can potentially damage the dielectrics and thus degrade the quality and reliability of the device. These unexpected charge issues make the product difficult to control from fabrication to fabrication. The greater charging typically takes place in the area where the oxide layer 606 is the thinnest. In other words, the center section 814 has the smallest impedance or opposition to current flow, in this example.

Figure 8A:
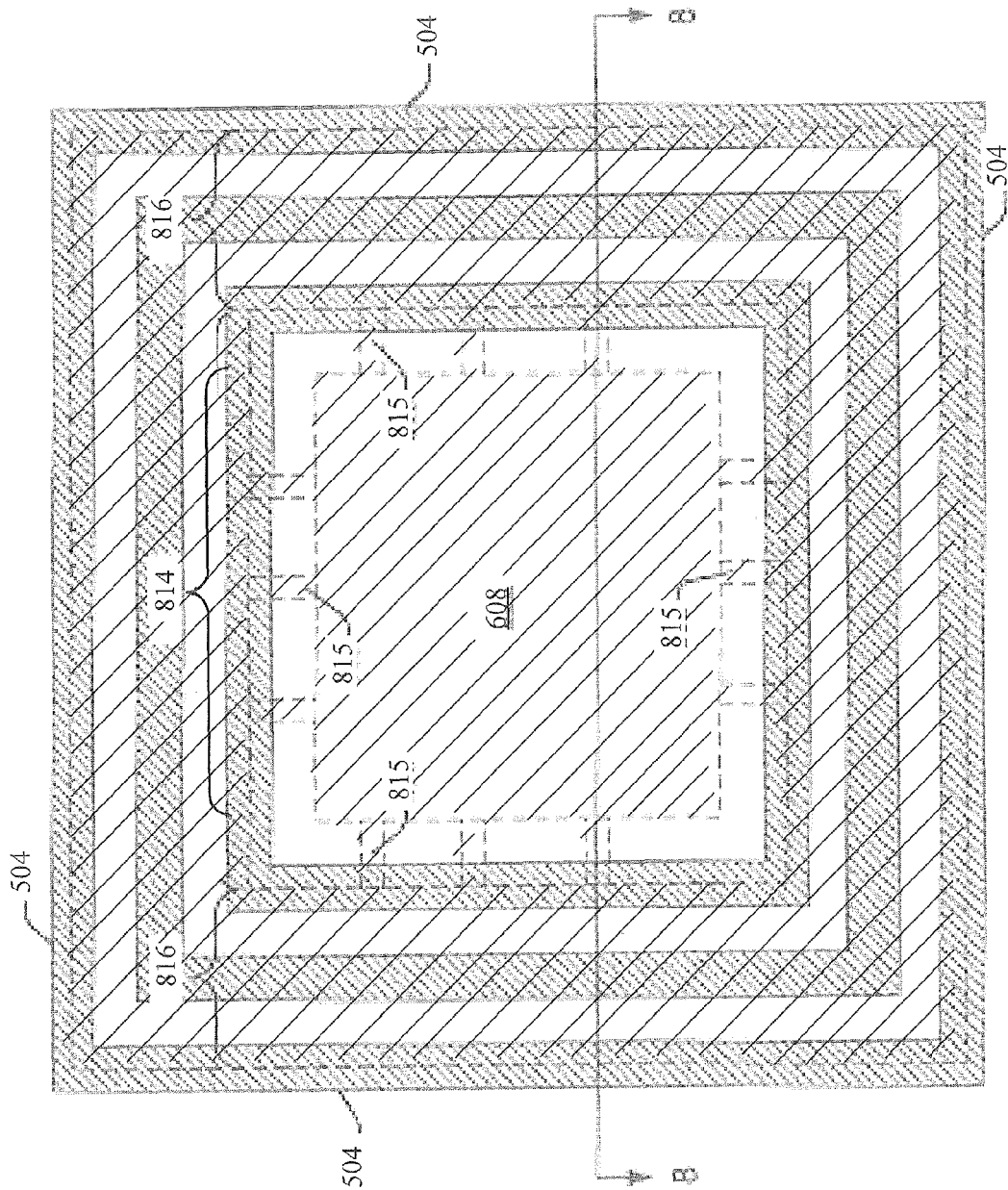
FIG. 8a is a plan view corresponding to FIG. 8.

The respective dummy tiles 816 are connected to an array or arrays of core cells 606 through the poly 1 layer 710, via the poly-bridges 815, as shown in FIG. 8a which can serve as a conductive path, and the electronic charge 712 distribution is influenced by the oxide layer 606 thickness, for example. For instance, the thinner oxide 606 in the center section 814 shown can have a greater number of charges 712 associated with the thinner section as opposed to the outside thicker oxide 606 sections, for example, wherein the core array area 608 can experience charge problems.

Typically, the performance of the semiconductor memory device 800 is decided mainly by the distribution of charge carriers, both electrons and holes, often referred to as the "doping profile". As devices continue to shrink it becomes increasingly more difficult to measure the precise doping level, for example. Other process steps in the fabrication of the memory device 800 can cause charge buildup, for example, etching, chemical mechanical polishing, and the like.

Figure 9:
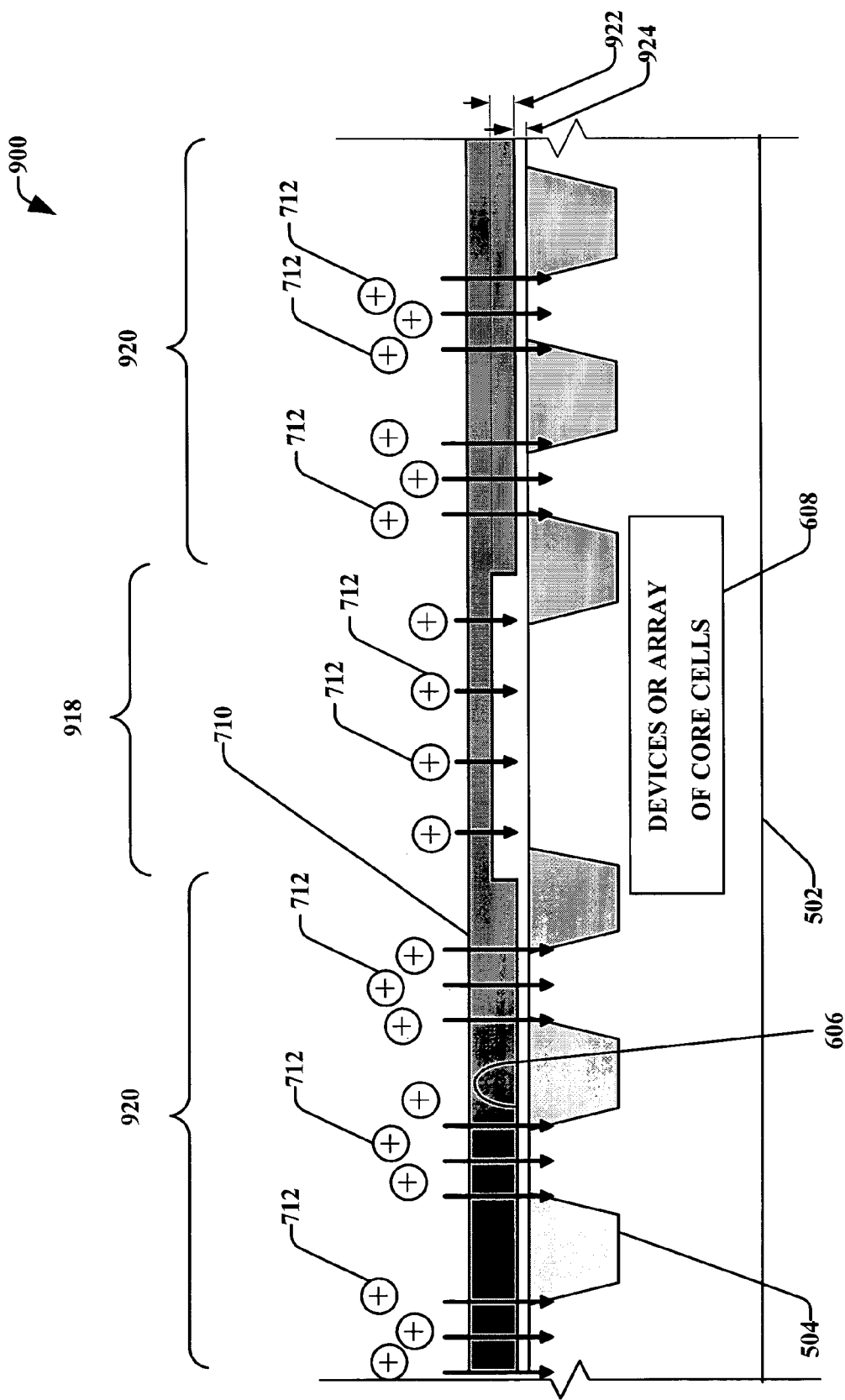
FIG. 9 is a side view of at least a portion of a memory core with dummy tiling that employs a very thin oxide area, according to yet another aspect of the invention.

Referring now to FIG. 9, illustrated is a side view of at least a portion 918 of a memory core 900, according to at least one aspect, and can include dummy tiles 920. The memory core 900 is formed upon a semiconductor substrate 502. Shallow trench isolation regions 504 can be formed within the substrate as described supra. An oxide layer 606 can be deposited upon the substrate 502 extending substantially over the entire substrate 502, and further includes a plurality of thicknesses as illustrated in FIG. 9. The oxide layer 606 is typically formed of an oxide dielectric such as silicon dioxide ($SiO_2$), an oxide-nitride-oxide composite layer, and the like. Alternatively, other types of oxide layers 606 or combinations thereof may be employed and are contemplated as falling within the scope of the present invention.

As illustrated in FIG. 9, for example, the oxide layer 606 can be deposited, masked with photoresist, etched, chemically mechanically polished, and the like to establish the various oxide 606 thicknesses, for example. As shown, the core array 608 in the center section 918 is protected by the dummy tiles 920 against typical charge issues, for example non-uniform charging, voltage breakdown, and the like. The center section 918 has a thicker oxide layer 606 while the outer section dummy tiles 920 have thinner oxide layers 606. The center section 918 oxide 606 thicknesses can be about 15 nanometers to about 30 nanometers, while the dummy tile oxide thickness can range from about 5 nanometers to about 10 nanometers. The dummy tile area can be about 1 micrometer to about 5 micrometers long and about 1 micrometer to about 5 micrometers wide. The spacing between two different dummy tiles can be about 1 micrometer to about 5 micrometers.

The larger thickness 922 oxide layer 606 in the center section 920 can result in a larger impedance at the core array 608 location, whereas the smaller thickness 924 oxide layer 606 of the dummy tiles 920 can result in a lower impedance. The lower impedance allows excess charge 712 to be drawn away from the core arrays 608 onto the dummy tiles 920, thereby protecting the core array 608 which can result in greater production yields, for example. In other words, the electrical field generated during this process will result in the flow of electrical charges 712 through the area with the thinnest 922 oxide 606, wherein the electrical field is the strongest, for example. By tailoring the proper oxide layer 606 thickness the device or array of core cells 608 can be protected. Alternatively, multiple oxide layers 606 made of differing materials, multiple oxide layer thicknesses and composite oxide layers 606 may be employed and are contemplated as falling within the scope of the present invention.

Figure 10:
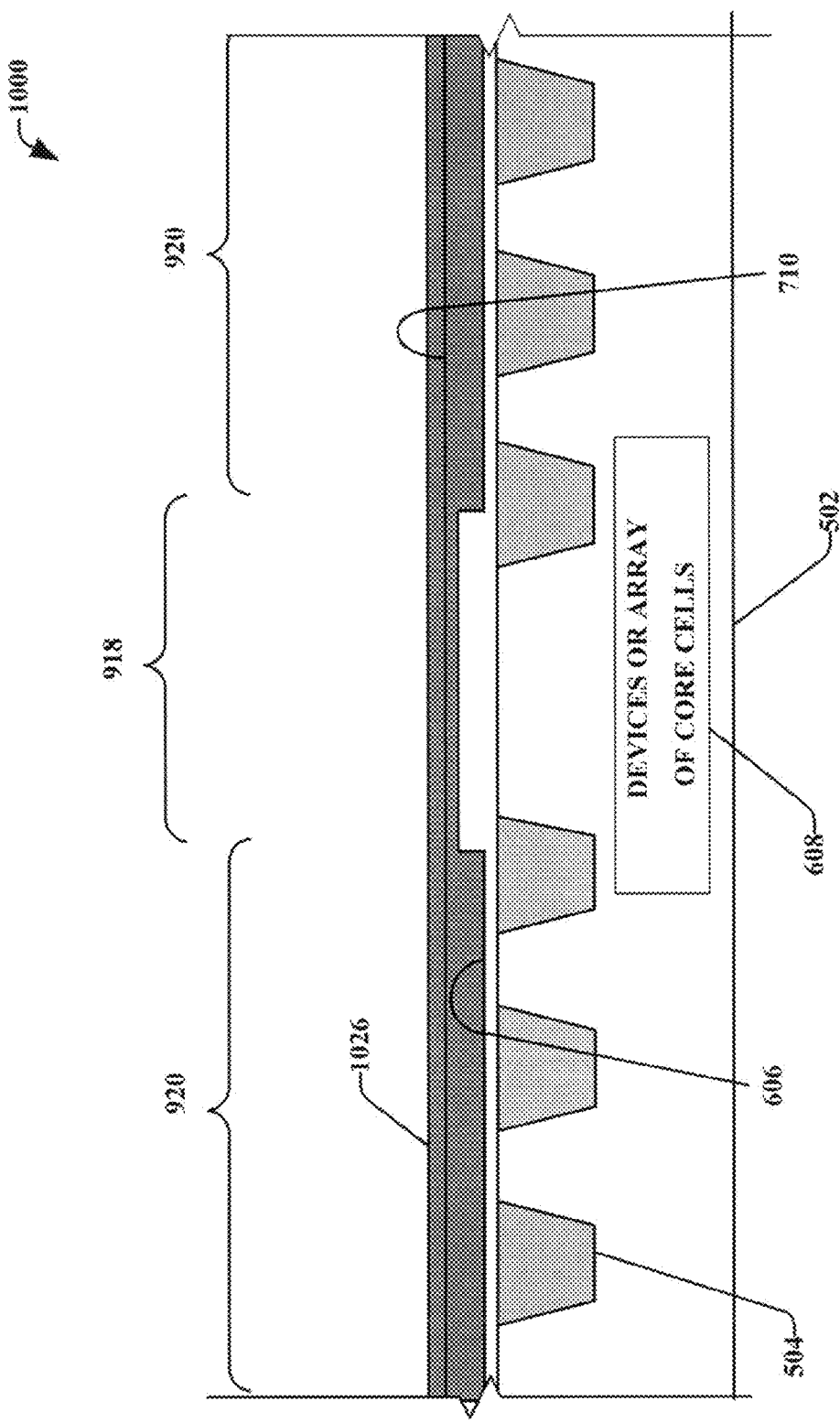
FIG. 10 is a cross-sectional side view according to another aspect of the invention, utilizing a first and second polysilicon layer.

Referring now to FIG. 10 is a cross-sectional side illustration of a portion of a flash memory device 1000. A semiconductor substrate 502 upon which the memory is formed can be doped with a p-type impurity such as boron, for example, to establish a threshold voltage (Vt) region therein. The threshold voltage implant can provide a region that is more heavily doped than the semiconductor substrate 502. The substrate can, for example, be formed out of silicon and can itself be doped with a p-type impurity.

A charge-trapping dielectric layer 606 can be deposited over the semiconductor substrate 502 and the STI regions 504, described previously. The charge-trapping dielectric layer 606 can be composed of three separate layers, for example: a first insulating layer, a charge-trapping layer, and a second insulating layer. These layers together can be referred to as the oxide layer 606 or the oxide layer 606 can refer to a single layer of silicon dioxide ($SiO_2$), for example. Alternatively, other types of oxide layers 606 may be employed and are contemplated as falling within the scope of the present invention.

A first polysilicon layer 710 is depicted in FIG. 10 overlying the oxide layer 606. It will be appreciated that the oxide layer 606 can be deposited, etched, chemically mechanically polished, and the like at different thicknesses so as to influence the flow of electrical charges. The electrical charges are typically formed during many of these processes and if not handled properly can result in damage, for example higher wafer threshold voltage, consequentially causing in a reduction in production yield. In one embodiment, a poly 2 layer 1026 can be deposited over the entire poly 1 surface 710.

Figure 11:
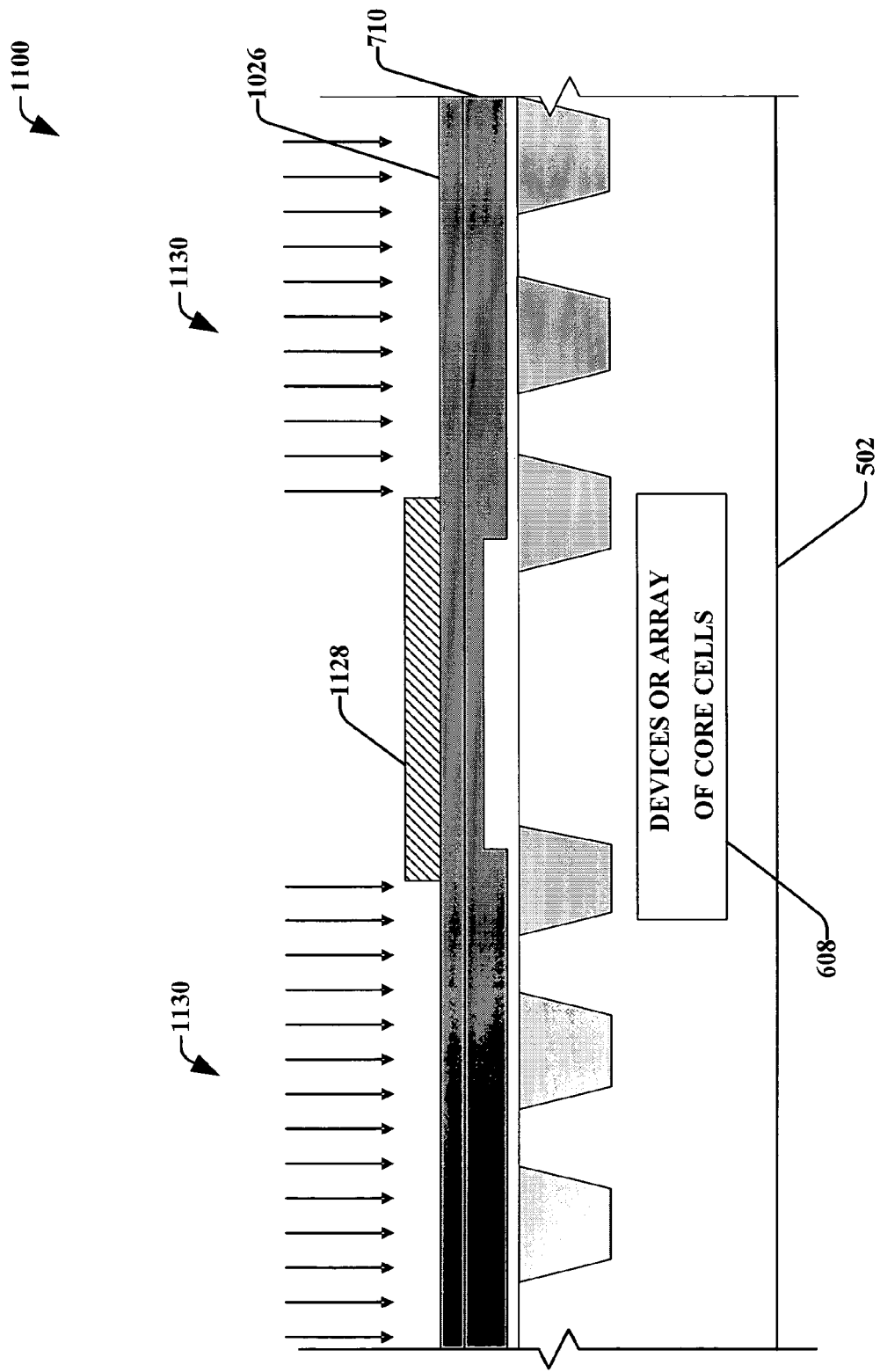
FIG. 11 is a cross-sectional illustration of memory formed according to one or more aspects of the present invention.

A conventional photoresist 1128 can be applied as illustrated in FIG. 11 at 1100, which is then utilized to pattern and etch the polysilicon 1 layer 710 and the polysilicon 2 layer 1026 in order remove a portion of the polysilicon 1 and poly 2 layers 710 and 1026 respectively, in the charge drain area and/or the periphery dummy tiles. The photoresist 1128 can be, for example, a solvent-based, light-sensitive resin solution that is uniformly applied, for example, on the polysilicon 2 layer 1026 of the wafer, utilizing a spin type process. The photoresist 1128 can, for example, be a chemical (negative photoresist 1128) that hardens when exposed to ultraviolet light 1130 or other light wavelengths and the unexposed photoresist 1128 can be dissolved by employing a developer solvent, leaving patterns of the insoluble exposed photoresist 1128. Another approach involves utilizing a positive photoresist 1128 that is initially insoluble, and when exposed to e.g., UV, mercury light, laser, x-rays, electron beam, etc., becomes soluble. The exposed poly 2 and poly 1 layers 1026 and 710 can be plasma etched, for example to remove the exposed areas.

Figure 12:
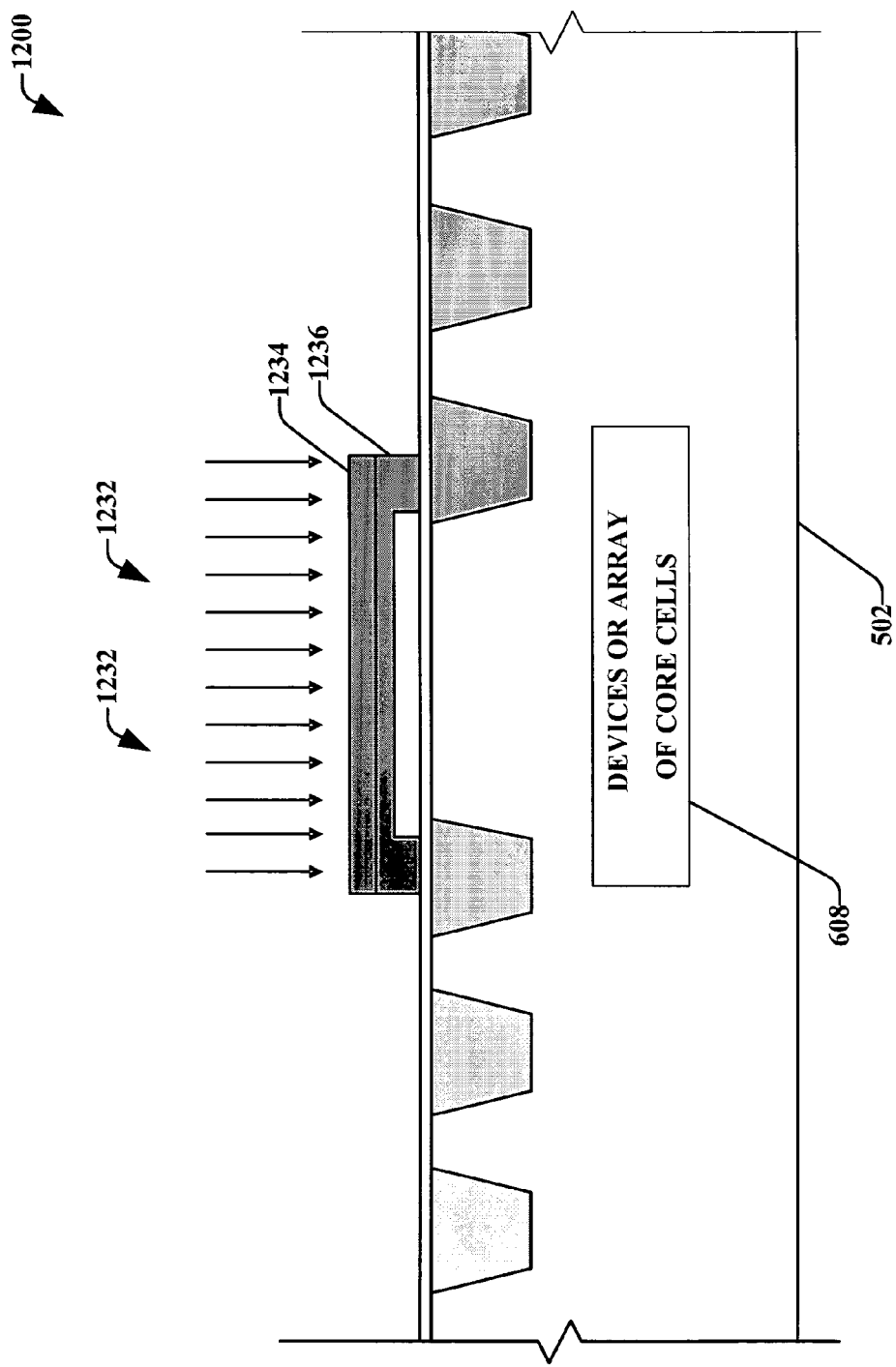
FIG. 12 is a cross-sectional illustration of memory formed according to yet another aspect of the present invention.
Figure 13:
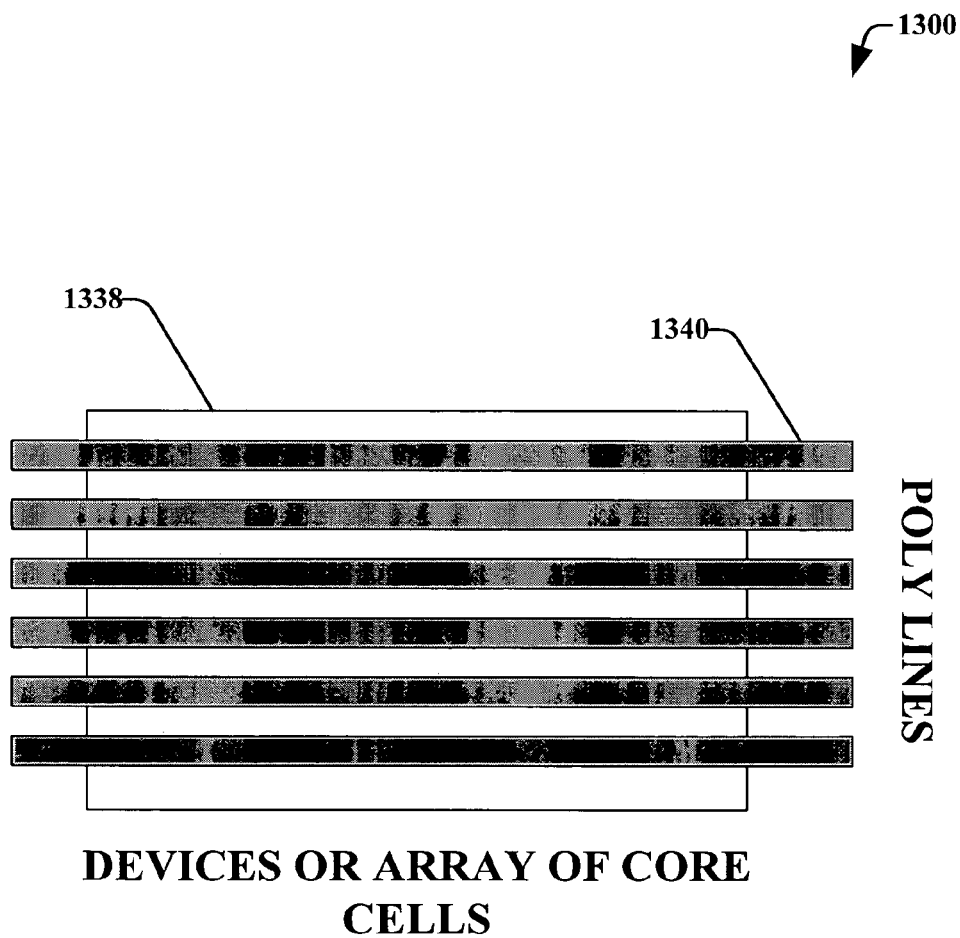
FIG. 13 is a top view of memory formed according to another aspect of the present invention after the second polysilicon layer is etched.

Turning to FIG. 12, at 1200 the photoresist (not shown) 1128 and the polysilicon layers on the top of dummy tiles (not shown) 920 have been removed. The photoresist 1128 can be removed by employing any known photolytic process or any other process that can be employed to create a pattern mask on an IC device. The remaining first and second polysilicon layers, 1236 and 1234 respectively, can be doped at 1232 over the core array of cells 608 of the substrate 502. Turning to FIG. 13, illustrated is a completed device or array of core cells 1338 with patterned polysilicon layers 1340.

Figure 14:
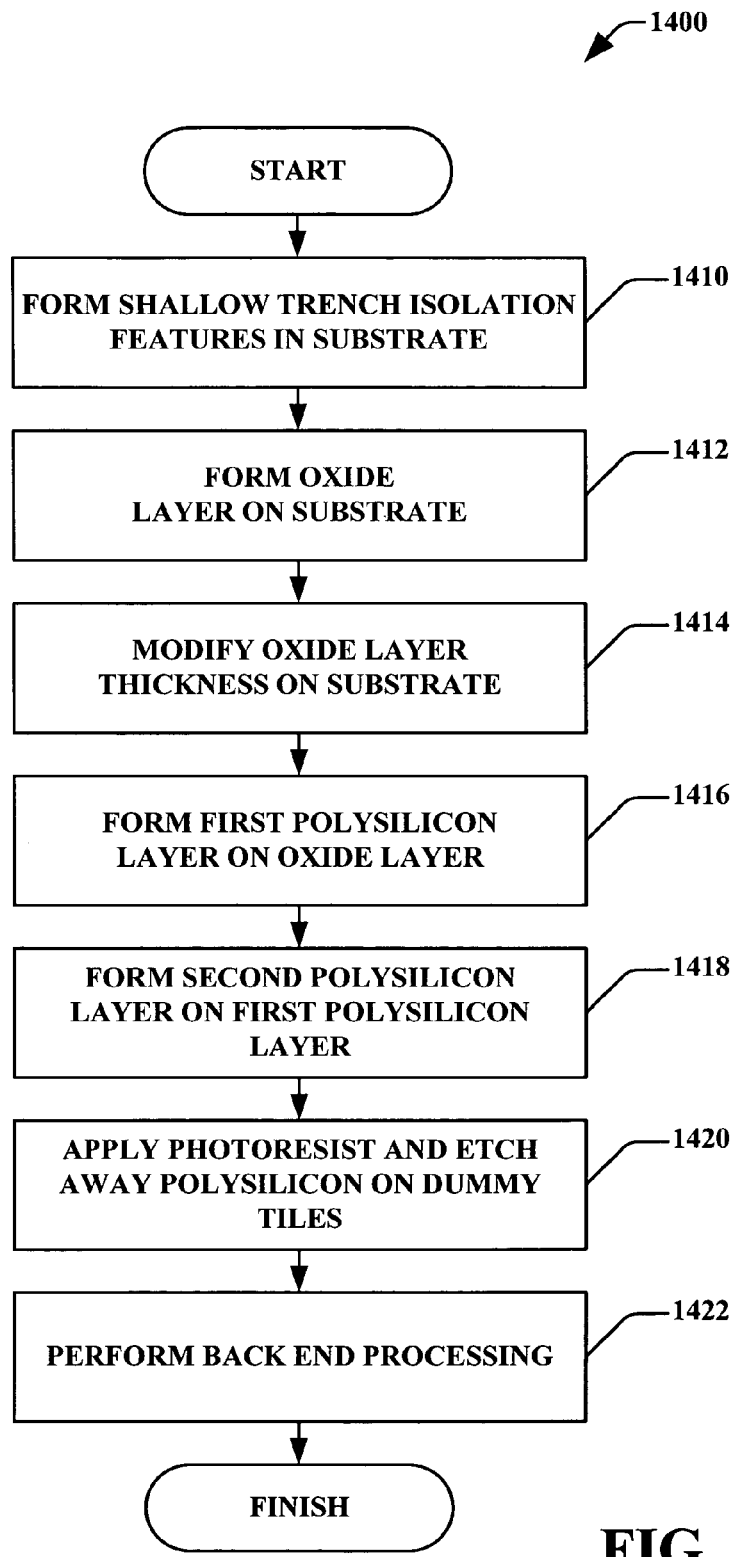
FIG. 14 is a flow diagram illustrating an example of a methodology for forming a memory device in accordance with one or more aspects of the present invention wherein dummy tiling is utilized in forming the memory device.

At FIG. 14 a methodology 1400 is illustrated for forming a memory device according to one or more aspects of the present invention. In particular, the memory can be formed with a dual poly process employing dummy tiling 920 to control the flow of electrical charge 712 during the fabrication process. The dummy tiling 920 can be ignored in subsequent steps when it is no longer needed. The memory device so formed can, for example, correspond to a portion of a memory core such as may include at least part of one of the M by N array cores depicted in FIG. 9.

Although the methodology 1400 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts may be carried out in one or more separate acts or phases.

It will be appreciated that a methodology carried out according to one or more aspects of the present invention may be implemented in association with the formation and/or processing of structures illustrated and described herein as well as in association with other structures not illustrated or described herein. By way of example, the method or variants thereof may be used to fabricate a dual bit memory as illustrated and described below with respect to FIGS. 3-7, as well as to devices not shown or described herein.

At 1410 the process begins and utilizes, for example shallow trench isolation regions 504 to establish a region of the substrate 502 that is more heavily doped than the remainder of the semiconductor substrate 502. The substrate 502 can, for example, be formed out of silicon and can itself be doped with a p-type impurity such as boron, for example. The threshold adjustment implant may include a greater concentration of and/or a higher energy implant of the same or different p-type dopant utilized in the rest of the substrate 502, for example, and assists in controlling a threshold voltage of the memory cell.

Shallow trench isolation (STI) 504 formed at step 1410 is a mainstream isolation method for advanced logic, mixed-signal, DRAM and other memory devices, for example. STI 504 can be fabricated utilizing known techniques by those of ordinary skill in the art. Typical STI 504 process steps can be growing a thin layer of pad oxide on the silicon 502 surface followed by, for example by CVD depositing a thick layer nitride over the pad oxide. The nitride is typically patterned employing photolytic processes and a trench is then etched (e.g., anisotropically, plasma, etc.) into the substrate 502. After a photoresist stripping process, the trench sidewalls can be protected against corrosion with a thin layer of thermal oxide. The trenches can then be filled with a thick oxide and afterward planarized using, for example, chemical mechanical polishing (CMP). Lastly, the nitride layer and the pad oxide can be removed, for example to complete the STI 504 process.

At 1412 a dummy tile oxide layer 606 is formed over the semiconductor substrate 502 and the STI regions 504 and covers the entire upper surface. The oxide layer 606 may be a multilayer composite or formed of a single oxide dielectric such as silicon dioxide ($SiO_2$), for example. The oxide 606 can go through a photolytic process at 1414 involving photoresist, developer, masking, etchants, chemical mechanical polishing, and the like, for example to reduce the thickness of the oxide 606 in a given area or areas. The oxide layer 606 thickness is varied so that electrical charge 712 flow and distribution can be controlled.

At 1416 a first ploy 1 layer 710 is formed over the oxide layer 606. This first poly layer 710 can be formed to a thickness of between about 500 to 1500 Angstroms, for example. The poly 1 layer 710 can be subsequently doped to increase the conductivity (reduce the resistance) of the poly-1 layer, for example. The poly-1 layer 710 can be doped, for example, utilizing diffusion, in situ doping, ion implantation, and the like. Diffusion doping comprises, for example, depositing a heavily-doped silicon glass over the poly-1 layer 710 with the glass serving as the source of dopant for the poly-1. The dopant diffusion can take place at a temperature of, for example, 900-1000 deg C. Ion implantation comprises directly bombarding the poly-1 layer 710 with high-energy ions, for example, while in situ doping employs dopant atoms that are established in the semiconductor during its growth, commonly during epitaxial growth of semiconductor layers, for example. The increased conductivity allows excess charge to be directed away from the poly-1 layer 710 to the dummy tiles 920.

At 1420 a layer of hardmask material can be subsequently formed over the poly-1 formation 710 or deposition. An optional antireflective coating (ARC) layer (e.g., of an organic material, such as silicon nitride or silicon oxynitride) can also be formed over the hardmask, and a resist can be formed over the ARC layer to facilitate patterning the hardmask. The ARC layer in particular can assist with mitigating reflection during exposure and thereby improves the fidelity of pattern transfer. The hardmask can, for example, be formed from oxide based material(s) that are applied to a thickness of between about 300 to 700 Angstroms, for example.

It is to be appreciated that the hardmask formation and hardmask patterning, for example, could also be carried out prior to the doping of the poly-1 layer 710. The spacings within the hardmask can be formed to have respective widths of between about 100 to 140 nanometers, for example.

At 1418 a second polysilicon layer 1026 can subsequently be formed over the first poly layer 710 (FIG. 10). Additional photolytic processes can be performed at step 1420 in order to remove the two polysilicon layers (710 and 1026, respectively) over the dummy tiles as well as patterning the word lines. Finally at step 1422 back end processes are then performed. These subsequent process steps are well known by those of ordinary skill in the art.

Figure 15:
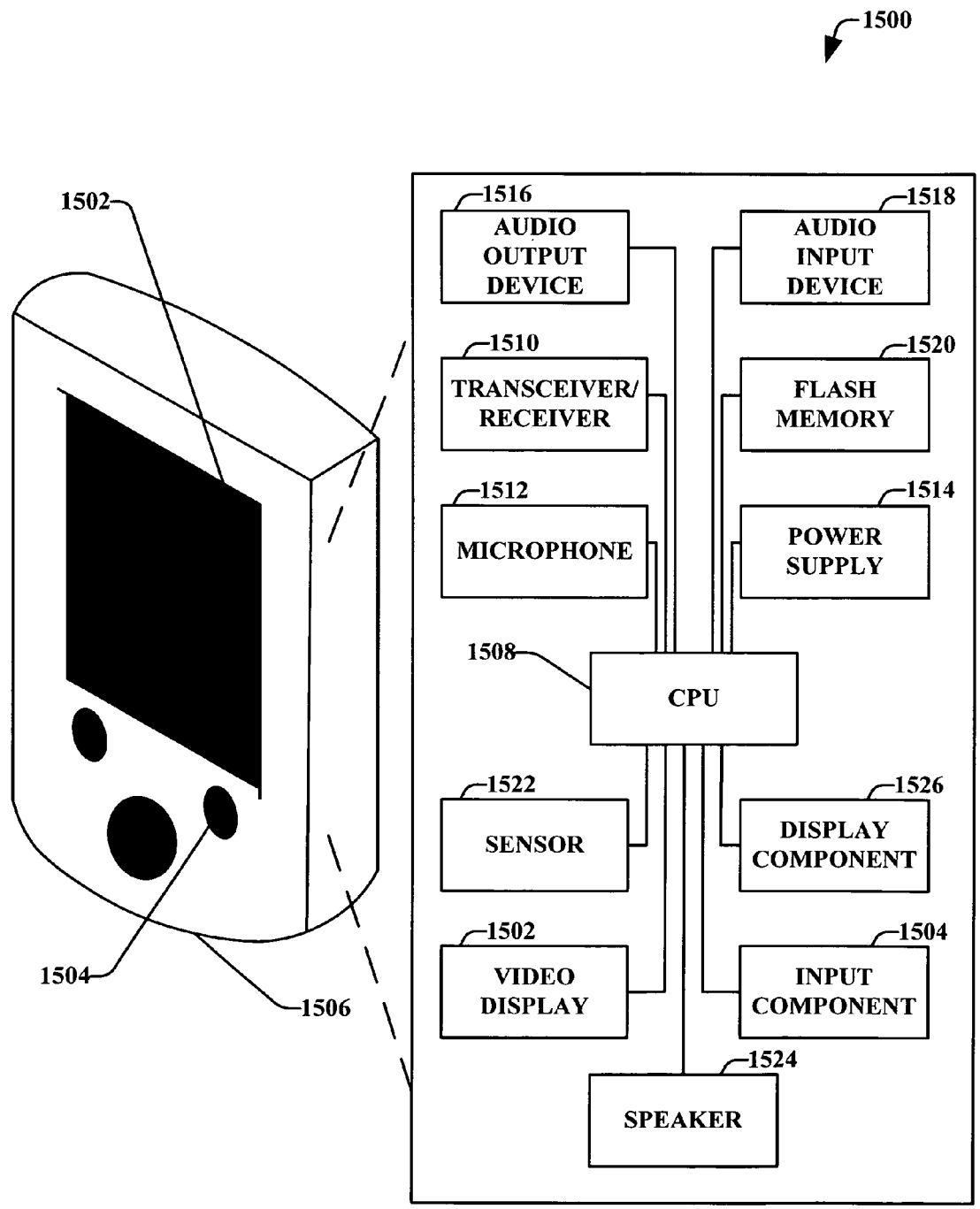
FIG. 15 is an isometric view of a device and block diagram according to yet one or more aspects of the present invention.

FIG. 15 is an exemplary portable electronic device, for example, a Personal Data Assistant (PDA) 1500 comprising a video display 1502, an input component 1504, a housing 1506, a CPU 1508, a transceiver and/or a receiver 1510, a microphone 1512, a power supply 1514, an audio output device 1516, an audio input 1518, flash memory 1520, various sensors 1522, and speaker(s) 1524. The flash memory 1520 manufactured according to a thin oxide dummy tiling discharge protection method, of the present invention. The audio input device 1518 can be a transducer, for example. The input component 1504 can include a keypad, buttons, dials, pressure keys, and the like. The video display 1502 can be a liquid crystal display, a plasma display, an LED display, and the like, for displaying visual data and information. In accordance with another embodiment of the claimed subject matter, the portable device with flash memory 1520 manufactured according to a thin oxide dummy tiling discharge protection method, of the present invention, comprises cell phones, memory sticks, flash drive devices, video camcorders, voice recorders, USB flash drives, fax machines, flash memory laptops, MP3 players, digital cameras, home video game consoles, hard drives, memory cards (used as solid-state disks in laptops), and the like. The flash memory 1520 can include random access memory, read only memory, optical memory, audio memory, magnetic memory, and the like.

According to one embodiment of the present invention, the CPU 1508 is configured to communicate with the audio input device 1518, the audio output device 1516 and a display component 1526. The display component 1526 can be separate and distinct from the video display 1502. The CPU 1508 can execute control functions based on inputs from the user, entered using the input component 1504, for example. Based on those inputs, for example the display component can display a graph, a photo, a map, a chart, a video, and the like. The PDA 1500 is also configured to output data as an audio signal, for example a song, a message, a warning sound, various tones, recordings, etc. In another embodiment of the present invention the PDA 1500 can communicate with other electronic devices, for example computers, cell phones, other PDAs, and the like. The PDA 1500 is also configured to transmit digital data wirelessly from one user to another. This is done utilizing the transmitter/receiver 1510 to either transmit or receive data. Additionally, sensors 1522 can be utilized to sense data external to the PDA 1500, for example, temperatures, radiation levels, pressures, and the like Various techniques for designing and manufacturing portable flash memory electronic devices are well known by those of ordinary skill in the art and all are contemplated in the present invention.

Although the invention has been shown and described with respect to one or more implementations, equivalent alterations and modifications will occur to others of ordinary skill in the art based upon a reading and understanding of this specification and the annexed drawings. The invention includes all such modifications and alterations and is limited only by the scope of the following claims. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of forming at least a portion of a memory core array upon a semiconductor substrate, the method comprising:
    forming shallow trench isolation structures in the substrate substantially surrounding a memory device region within the memory core array;
    forming an oxide layer over the substrate in the memory device region and over the shallow trench isolation structures;
        wherein an inner section of the oxide layer formed over the memory device region is thicker than an outer section of the oxide layer formed over the shallow trench isolation structures substantially surrounding the memory device region;
    forming a first polysilicon layer over the inner and outer sections of the oxide layer, and patterning the first polysilicon layer, wherein the patterned first polysilicon layer comprises one or more polysilicon dummy tiles formed over the outer section of the oxide layer, and wherein the patterned first polysilicon layer further comprises at least one inner section of the patterned first polysilicon layer formed over the inner section of the oxide layer that is electrically connected to the one or more polysilicon dummy tiles, wherein the one or more polysilicon dummy tiles are connected to the at least one inner section of the patterned first polysilicon layer by one or more polysilicon bridges formed by patterned portions of the first polysilicon layer; and
    continuously maintaining the presence of the one or more polysilicon bridges until formation and patterning of a second polysilicon layer within the memory device region.

2. The method of claim 1, wherein the oxide layer comprises at least one of the following oxides: silicon dioxide, and oxide-nitride-oxide composite.

3. The method of claim 1, wherein the thickness of the inner section of the oxide layer is between about 150 to 300 Angstroms.

4. The method of claim 3, wherein the thickness of the outer section of the oxide layer is between about 50 to 100 Angstroms.

5. The method of claim 1, wherein the inner section of the oxide layer is formed over substantially the entire memory device region.

6. The method of claim 5, further comprising
patterning and doping the first polysilicon layer, wherein the doping of the first polysilicon layer has a resulting dopant concentration of about 2E20/cm³.

7. The method of claim 1, further comprising
forming the second polysilicon layer over the first polysilicon layer, the second polysilicon layer formed to a thickness of between about 500 to 5000 Angstroms.

8. The method of claim 1, further comprising:
providing an electrical charge to the first polysilicon layer, whereby a greater proportion of the charge distributes to the outer section of the oxide layer than to the inner section of the oxide layer formed over the memory device region, thereby protecting the memory device region from charge issues.

9. The method of claim 1, wherein the inner section of the oxide layer is formed over substantially the entire memory device region, and the outer section of the oxide layer is formed over substantially the entire shallow trench isolation structures substantially surrounding the memory device region.

10. The method of claim 1, wherein the inner section of the oxide layer is about three times thicker than the outer section of the oxide layer or greater.

11. The method of claim 1, further comprising selectively etching the first polysilicon layer to remove the one or more polysilicon bridges after formation and patterning of the second polysilicon layer within the memory device region is completed.

12. A method of forming at least a portion of a memory cell arrangement upon a semiconductor substrate, the method comprising:
forming a memory device region within the memory cell arrangement on the substrate;
forming a non-uniform oxide layer over the substrate, over the memory device region, and over a region adjacent to the memory device region;
wherein an inner section of the non-uniform oxide layer formed over the memory device region is thicker than an outer section of the non-uniform oxide layer formed over the region adjacent to the memory device region;
forming a first polysilicon layer over the inner and outer sections of the non-uniform oxide layer, and patterning the first polysilicon layer, wherein the patterned first polysilicon layer comprises one or more polysilicon dummy tiles formed over the outer section of the non-uniform oxide layer, and wherein the patterned first polysilicon layer further comprises at least one inner section of the patterned first polysilicon layer formed over the inner section of the non-uniform oxide layer that is electrically connected to the one or more polysilicon dummy tiles, wherein the one or more polysilicon dummy tiles are connected to the at least one inner section the patterned first polysilicon layer by one or more polysilicon bridges formed by patterned portions of the first polysilicon layer; and
continuously maintaining the presence of the one or more polysilicon bridges until formation and patterning of a second polysilicon layer within the memory device region.

13. The method of claim 12, wherein the first polysilicon layer is formed to a thickness of between about 500 to 1500 Angstroms.

14. The method of claim 12, wherein the inner section of the non-uniform oxide layer is about three times thicker than the outer section of the non-uniform oxide layer or greater.

15. The method of claim 12, further comprising:
providing an electrical charge to the first polysilicon layer, whereby a greater proportion of the charge distributes to the outer section of the non-uniform oxide layer than to the inner section of the non-uniform oxide layer formed over the memory device region, thereby protecting the memory device region from charge issues.

16. The method of claim 12, wherein the first polysilicon layer is formed over substantially the entire inner section of the non-uniform oxide layer and over substantially the entire memory device region.

17. The method of claim 12, wherein the forming of the first polysilicon layer comprises:
patterning and doping the first polysilicon layer; and
wherein the method further comprises
forming the second polysilicon layer over the first polysilicon layer;
forming at least one memory core.

18. The method of claim 12, further comprising
forming a bitline on the memory cell arrangement, wherein a bitline implant is performed at an energy level of around 5 KeV to 40 KeV.

19. The method of claim 12, further comprising
patterning and doping the first polysilicon layer, wherein the doping of the first polysilicon layer is performed at a dosage of about 1 E15/cm².

20. The method of claim 12, further comprising selectively etching the first polysilicon layer to remove the one or more polysilicon bridges after formation and patterning of the second polysilicon layer within the memory device region is completed.

* * * * *